United States Patent [19]

Veith et al.

[11] 4,427,954

[45] Jan. 24, 1984

[54] PULSE COMPRESSION FILTER DESIGNED AS A DISPERSIVE DELAY LINE

[75] Inventors: Richard Veith, Unterhaching; Helmut Stocker, Zorneding, both of Fed. Rep. of Germany

[73] Assignee: Siemens Aktiengesellschaft, Berlin & Munich, Fed. Rep. of Germany

[21] Appl. No.: 377,466

[22] Filed: May 12, 1982

[30] Foreign Application Priority Data

May 29, 1981 [DE] Fed. Rep. of Germany ....... 3121516

[51] Int. Cl.³ .................. H03H 9/44; H03H 9/64; H03H 9/145
[52] U.S. Cl. .................. 333/153; 333/154; 333/195; 333/196
[58] Field of Search .......................... 333/150–155, 333/193–196; 310/313 R, 313 A, 313 B, 313 C, 313 D

[56] References Cited

U.S. PATENT DOCUMENTS 3,813,618 5/1974 Hartemann et al. ............... 333/193
3,882,430 5/1975 Maerfeld ........................... 333/153
3,975,697 8/1976 Paige ................................. 333/153

Primary Examiner—Marvin L. Nussbaum
Attorney, Agent, or Firm—Hill, Van Santen, Steadman & Simpson

[57] ABSTRACT

A pulse compression filter designed as a dispersive delay line functions with acoustic waves having a mean wavelength $\lambda_o$ in the filter. At least one input/output transducer or at least one reflector arrangement is provided with a plurality of electrode respectively reflector fingers distributed on a substrate in accordance with a prescribed transfer function which has a given bandwidth and whose Fourier transform has a given time duration T. Said fingers are divided into a plurality of N finger groups designed identical to one another with respect to the number fingers n and corresponding finger spacings of corresponding fingers. Each finger group has a length in a propagation direction of the acoustic wave in the filter which is at least equal to the mean wavelength $\lambda_o$. Center spacings of adjacent finger groups from one another are non-equidistant in accordance with the prescribed transfer function. The plurality N of the finger groups is greater than the time bandwidth duration product (T·B).

11 Claims, 7 Drawing Figures

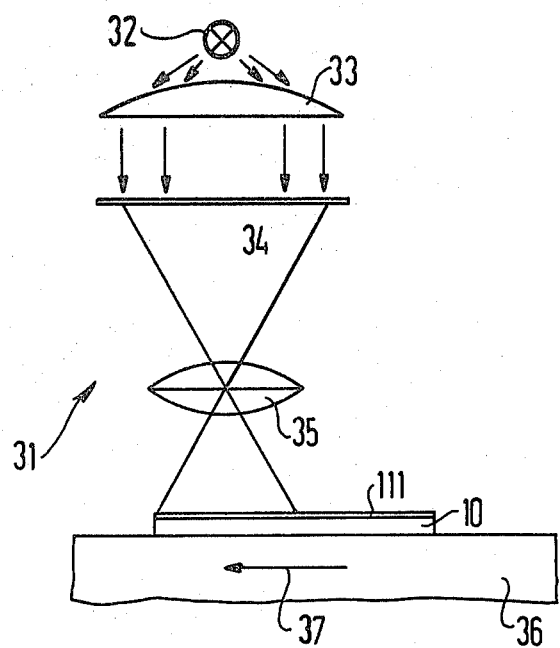
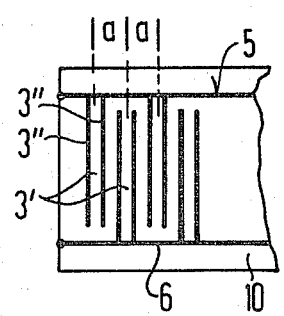
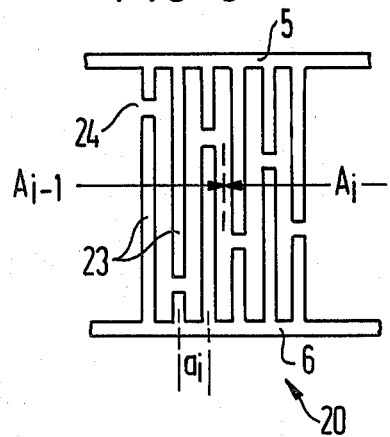

PULSE COMPRESSION FILTER DESIGNED AS A DISPERSIVE DELAY LINE

BACKGROUND OF THE INVENTION

The present invention relates to a pulse compression filter designed as a dispersive delay line which functions with acoustic waves and has a prescribed center frequency which produces a corresponding mean wave length in the filter. A transducer for either the input or output typically has a plurality of electrode fingers and wherein a distribution of the fingers corresponds to a prescribed transfer function.

Pulse compression filters with which a pulse of short time duration can be transformed into a pulse of duration T repesenting a long time duration are particularly employed in radar technology. This is generally carried out at the transmit side. Presuming that a matched filter is employed at the receive side, the pulse which has been time expanded at the transmit side with a pulse comression filter can be converted back into a short pulse with a time duration greater than and/or equal to 1/B. This reconverted pulse is necessarily accompanied by side lobes with a more or less slight amplitude level which depend on the prescribed filter transfer function and the product of the duraction T of the expanded pulse and the bandwidth B of the filter ($=T \cdot B$).

The technique of pulse expansion at the transmit side is particularly employed in order to be able to transmit a radar pulse with a high energy content given a limited transmit power. By means of compression again undertaken at the receive side, the high time resolution can be approximately retained which would be achieved given a transmission of the original, short pulse. The higher pulse energy makes a greater range possible for a radar system equipped with such a pulse expansion/compression.

The theoretically based advantages of pulse expansion/compression are not entirely achieved in practice, because, among other things, of the limited technical expense of the filter. The time side lobes, however, occur not only because of the limited value of the product $T \cdot B$ of the pulse compression filters but, rather, they also appear given practically employed filters which have tolerances associated with the topical disposition of the electrode fingers.

Such fingers have associated therewith a piezo-electrical substrate on whose surface the electrode fingers are disposed in a distribution prescribed by the transfer function. Bus bars are selectively connected to the electrode fingers.

There are various types of pulse compression filters. One such type is designed as a tapped phase-encoded delay line. It contains electrode fingers in a disposition such that electrode fingers combined in groups which are connected to the one or to the other feed electrode (bus bar) have a successively different phase, whereby the succession of different phases of the group follows a prescribed encoding. Such a phase-encoded line has the disadvantage that relatively high side lobes whose minimum height is fixed by the number of phase shifts in the transmitted pulse occur in the compressed pulse. Moreover, such a line also has the disadvantage that it is very sensitive to frequency shifts in the pulse signal and/or in the line, for example due to the Doppler effect or due to a temperature of the substrate.

Such disadvantages are avoided given a pulse compression filter designed as a dispersive delay line. Such a line, however, has the disadvantage on the other hand that its mutually adjacent electrode fingers have spacings from one another which continuously differ, for example, a spacing which increases of decreases continuously from electrode finger to electrode finger. This causes technological manufacturing difficulties because such a filter can easily have a length of 10 to 15 cm. The values for the width dimension and the spacing of the electrode fingers from one another go down to a size of 1 $\mu$m. Tolerances of up to less than 0.1 $\mu$m must be observed for the precision of the limitations and the spacings of the electrode fingers in order to avoid disruptive side lobes of the recompressed pluse. It is advantageous to manufacture such structures photolithographically with a reducing projection of a master on the substrate. In practice, however, projection means which are sufficiently distortion-free are only available in which the diameter of the image field amounts only to a fraction of the length of the finger structure. One is therefore forced to manufacture the entire electrode finger structure with a continuously changing electrode finger spacing composed of a plurality of sections.

It has been shown that support/forward feeds for projcetion devices are definitely available which allow the relative feed of the substrate and master to be realized with high precision. If, however, one must change the master, as is required given an electrode finger spacing which constantly changes, then imprecisions in the electrode finger structure result which cannot be tolerated. One way of avoiding the difficulty described above is that each individual electrode finger of the filter or respectively of the line, is manufactured by means of individual exposure, i.e. by an individual technique. The time for executing such a method is not economical for the manufacture of a pulse compression filter with such an electrode finger structure.

Only for the sake of completeness we should like to point out the method of copying with contact printing of a mask. This, however, is less advantageous because of the contamination of the substrate surface which is connected therewith.

SUMMARY OF THE INVENTION

An object of the present invention is to provide a technique with which the technological difficulties of manufacturing a pulse compression filter in the manner of a dispersive delay line are avoided so that a high attenuation of the side lobes and/or low sensitivity to frequency deviation (Doppler effect, temperature effects) results.

This object is achieved for the pulse compression filter of a general type as described above by dividing the electrode fingers into a plurality of N finger groups designed identical to one another with respect to the number of fingers n and corresponding finger spacings of corresponding fingers. Each finger group has a length in propagation direction of the a acoustic wave in the filter which is at least equal to a mean wave length $\lambda_o$. The enter spacings of adjacent finger groups from one another are unequal distances in accordance with the prescribed transfer function. The plurality N of the finger groups is greater than the time bandwith duration product ($T \cdot B$).

The present invention is based on the consideration of eliminating or respectively significantly reducing the technological difficulties in the manufacture of a pulse compression filter designed as a dispersive delay line.

With the invention, an electrode finger structure is designed to replace prior art structures with electrode fingers having continuously non-equidistant spacings, and wherein the new structure can be manufactured with correspondingly greater ease. Of course, this electrode finger structure which replaces the old structure must not lead to technical disadvantages, i.e. the transfer properties of the inventive filter must meet the conditions generally required, or required in individual cases to a degree which is still sufficient. For example, in the standard or normal case it suffices if the side lobes in the pulse re-compressed on the receive side are only at least 30 dB smaller than the amplitude of the primary lobe of the compressed pulse.

With the invention, groups are employed which respectively consist of a limited plurality of electrode fingers instead of a complete group of electrode fingers with constantly increasing spacings from one another. A plurality of n finger groups is employed which are identically designed with respect to the plurality n of the electrode fingers forming the finger groups and with respect to the spacings of the n electrode fingers in the individual finger group. It should also be pointed out that the spacing between adjacent electrode fingers within the finger groups need not be equidistant; this distribution then applies with the same validity to all N finger groups.

For these finger groups, the manufacture of a single, preferably enlarged master suffices. This master is projected (reduced) onto the photolithographic layer of the filter substrate in the lithographic method. The necessary transfer function is taken into consideration such that the respective spacing from the center of the one finger group to the center of the next finger group (center distance) is dimensioned contiunously greater (or smaller).

The decisive advantage of such a filter with replacement finger groups is that each individual finger group can be employed with one and the same master inserted in the projection device for exposure in the photolithographic process. One finger group after the other is projected in chronological succession, namely after the necessary lateral displacement (in the direction or counter-direction of the later propagation direction of the wave in the finished filter) with the dimension of the respective spacing between adjacent finger groups prescribed by the given transfer function. An exact lateral displacement of the master and the filter substrate relative to one another which must be precise within tenths of a micrometer, is relatively not difficult. Given the invention, however, the changing of the master as required in the prior art, and which would necessarily lead to increased imprecisions in the manufacture of the finger structure, is avoided.

Let it be pointed out concerning the invention that the finger groups which have a length 1 in the propagation direction of the wave in the filter which is at least approximnately equal to the mean path length $\lambda_o$ dare not be confused or equated with such arrangements which have so-called "split fingers". Such split finger arrangements replace or represent a single electrode finger per se. Therefore, such split finger arrangements also have a length (measured over the entire length of the split finger arrangement in the propagation direction) which does not significantly exceed $\lambda_o/2$. In the invention, the length of the finger group, even given a small number of fingers contained therein, already is a multiple of $\lambda_o/2$. When a diluted disposition of electrode fingers is provided within the individual finger group provided in the invention, i.e. when the spacing from one electrode to the adjacent electrode finger is a multiple of $\lambda_o/2$, then the finger groups provided in the manner of the invention have a length 1 (in the propagation direction of the wave) which far exceeds an arrangement of so-called split fingers with the same plurality of fingers. Moreover, it should also be pointed out concerning "split fingers" that the adjacent finger strips of the individual, respective split fingers are all electrically connected to one another. Concerning the invention, however, it should also be noted that the n individual electrode fingers in the N finger groups of the inventively designed pulse compression filter can be additionally designed per se as split fingers, whereby as already indicated above all of the finger strips which respectively replace the individual electrode fingers of the n electrode fingers are not wider than $\lambda_o/2$.

BRIEF DESCRIPTION OF THE DRAWINGS

FIG. 3 shows a device known per se for the manufacture of a pulse compression filter according to the present invention;

FIG. 4 shows a diagramatic illustration concerning the term "split fingers";

FIG. 5 illustrates in a detailed view a finger group with weighted fingers;

DESCRIPTION OF THE PREFERRED EMBODIMENTS

Figure 1:
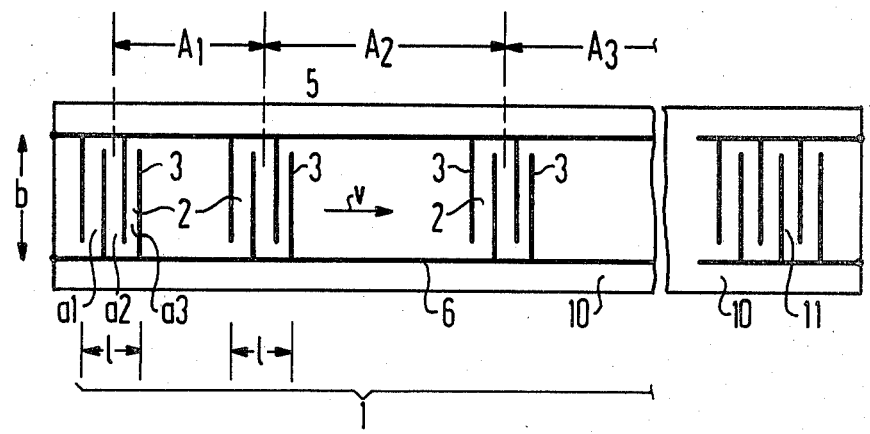
FIG. 1 shows a pulse compression filter according to the invention with finger groups having non-equidistant spacings from one another.

FIG. 1 shows a schematic illustration of a pulse compression filter with an input transducer 1 on a substrate 10. An output transducer is referenced 11. As a section of the input transducer 1, N=3 finger groups 2 are shown in FIG. 1 which respectively consist of n=4 individual fingers 3 which have spacings $a_1$, $a_2$, and $a_3$, wherein $a_1 \neq a_2 \neq a_3$ can apply. The center spacings $A_1$, $A_2$ and $A_3$ of the respectively adjacent finger groups 2 are of different size in accordancw with the invention. They derive from the transfer function prescribed for the corresponding pulse compression filter. Concerning the plurality n of electrode fingers 3, the spacings $a_1$, $a_2$, $a_3$ . . . , and the geometrical finger length 1 orthogonal to the propagation direction v, the individual finger groups 2 are identically dimensioned. Differing active finger lengths can be provided for the electrode fingers 3 of a finger group 2 (each finger group 2), namely in accordance with a weighting of the fingers. This transducer 1 can be the input or the output transducer. However, the input transducer and output transducer can be designed according to the transducer 1.

Figure 2:
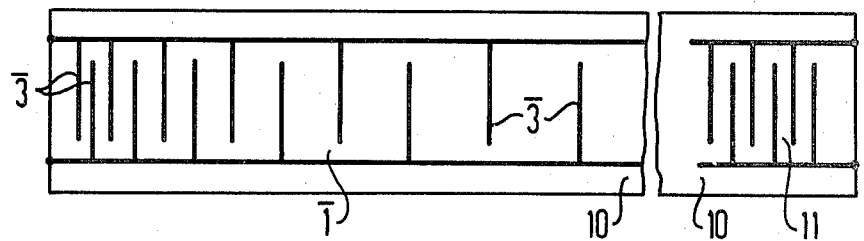
FIG. 2 shows the known pulse compression filter designed as a dispersive delay line which is relevant to the present invention.

FIG. 2 shows the schematic illustration of a known pulse compression filter in the manner of a dispersive delay line whose transducer 1 consists of a multitude of electrode fingers 3, whereby (in FIG. 2) the spacing of the individual electrode fingers 3 in the direction v increases continuously. This existing and known spacing increase or the distribution of the electrode finger 3 over the entire length of the known pulse compression filter illustrated in FIG. 2 again derives from the prescribed transfer function.

For the example of FIG. 1 of this inventive filter, a repetitive increase of the spacings $A_1$, $A_2$, $A_3$ . . . is provided and, given observation of the condition $N > T \cdot B$ according to the claims, it suffices that the spacing values $A_i$ increase in a graduation which is not as fine as is the case in the example of FIG. 2 of the known filter.

As a rule, the preferred, respective center spacing $a_i$ of two adjacent electrode fingers 3 within a finger group 2 amounts to $\lambda_o/2$, whereby the strip width of an individual electrode finger 3 is dimensioned with $\lambda_o/4$. $\lambda_o$ is the wavelength of the acoustic wave in the substrate, namely for the center frequency value $f_o$ of the frequency band of the transfer function. Given this example, thus a finger group 2 has a length l in the propagation direction v of the wave, i.e. approximated to the center spacing between the two outermost electrode fingers 3 of a finger group 2, of $l = 3 \lambda_o/2$. In the practical realization of an inventive pulse compression filter, a finger group 2, for example, contains a plurality $n = 4$ to 20 electrode fingers 3, and the entire filter consists of, for example, $N = 10$ to 1000 finger groups 2. In the standard case, the overall length from the first finger group 2 up to and including the last finger group 2 of an inventive filter according to FIG. 1 is equal to the overall length of a comparable, known filter according to FIG. 2.

In the manufacturing process of a filter according to FIG. 1, a single master for the four electrode fingers 3 of a finger group 2 is employed in the projection means. FIG. 3 shows such a projection means 31 with a light source 32, a condenser 33, the master 34, the imaging lens 35, and the substrate 10 of the filter 1 on whose surface the image of the master 34 is reproduced in reduced form. The surface of the substrate 10 is covered with a photosensitive layer 111. Further details of the photolithographic process are well known to those skilled in the art and therefore need not be explained in detail here.

In the device 31, the substrate 10 is situated on a support 36 which (relative to the master 34) can be displaced in the direction 37 by micro-adjustments. Thus, a finger group of the master 34 can be projected with the highest possible precision on a prescribed location of the photo-emulsion layer 111 situated on the substrate 10, i.e. the layer 36 is shifted forward by the spacings $A_i$ from finger group to finger group 2.

The manner in which the individual electrode fingers 3 are electrically connected to the two bus bars 5 and 6 also proceeds from FIG. 1. In that regard, FIG. 4 shows an individual finger group 2' in which the electrode fingers 3' are realized as a "split finger" execution. As illustrated, each "split finger" electrode finger 3' consists of two adjacent, mutually connected finger strips 3" and 3'" which are electrically connected in parallel. The two respective finger strips 3" and 3'" as well as the interstice situated between them have an overall width $3\lambda_o/8$, namely of approximately the same size as a finger 3 (or 3 as well). The illustration of FIG. 4 contains four electrode fingers 3' respectively split into two finger strips 3", 3'".

By way of example, FIG. 5 shows the embodiment of a single finger group 20 with weighted fingers 23 as are sufficiently known in and out of themselves. This finger weighting serves for the realization of the prescribed amplitude curve of the existing transfer function. In the standard case, the weighting of the electroe fingers 23 for the individual finger groups 20 of the entire pulse compression filter is quite different, i.e. identity no longer exists in this regard for all N finger groups relative to one another. This, however, is not a deficiency or disadvantage of the invention. Even an embodiment of finger groups 20 with weighted fingers 23 is manufactured with a device according to FIG. 3 according to the principle of the invention described above. The fingers 23 are manufactured with a separation location which is noted at 24.

Figure 6:
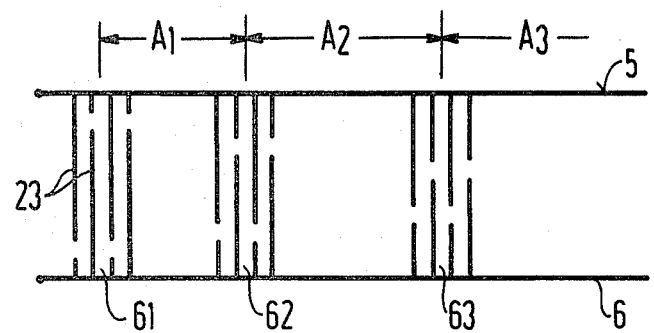
FIG. 6 shows three finger groups of a pulse compression filter according to the invention with finger weighting varied in group-wise fashion.

As FIG. 6 shows for three finger groups 61, 62, and 63, in accordance with a further preferred development of the invention, the known finger weighting of a known filter according to FIG. 2 is realized in equivalent fashion in a simplified form in such manner that the finger weighting of all electrode fingers 23 is identical within an individual finger group 61, 62, 6, but that this finger weighting is varied in steps from finger group to finger group (corresponding approximately to the prescribed transfer function).

Figure 7:
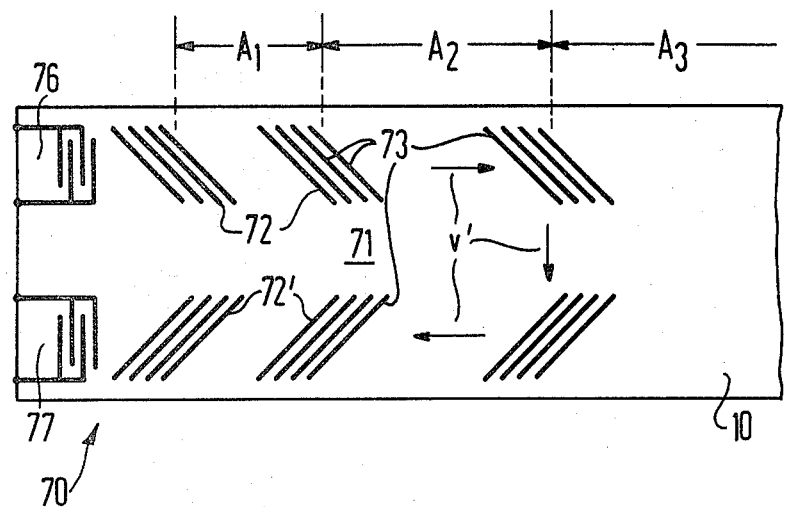
FIG. 7 shows a "reflective array compressor" with a reflector designed according to the invention.

The invention can also be employed for the reflector grid of a pulse compression filter, this being known to one skilled in the art as a "reflective array compressor". As shown in FIG. 7, such a filter 70 has input and output transducers 76, 77. These are transducers of a general type with inter-digital electrode fingers. The transducers are situated on a substrate 10 which must be piezō-electric in the area of said transducers. In the remaining area, namely in the area of the reflector grid 71, this substrate 10 need not be piezo-electric.

Known "reflective array compressors" have hitherto been realized in such manner that the reflector fingers placed obliquely relative to one another have a continuously increasing (or decreasing) spacing from one another, as is shown in FIG. 2 for the electrode fingers of the transducer 1.

FIG. 7 shows an arrangement 71 of the reflector fingers 73 in accordance with the invention. These reflector fingers 73 are subdivided among N finger groups 72 and among N finger groups 72'. A respectie finger group 72 and a finger group 72' lying opposite it belong together as a unit, so that N such units are to be provided in the sense of the invention. Each finger group 72, 72' consists of n reflector fingers 73. The finger groups 72 and the finger groups 72' are identical to one another. Their oblique positioning necessary for the reflection corresponds to the prior art. The path of the acoustic wave is indicated with v' for one unit of the finger groups 72, 72', the transducer 76 being assumed as the input transducer for this purpose.

In the filter 70, the reflector fingers can be metal strips (however without bus bar), described as electrode fingers in the aforementioned filter. However, electrical conductivity for these fingers is not necessary for them to function as reflectors. The reflector fingers 73 can also be strip-shaped grooves which are introduced (for example, etched) in the surface of the substrate 10.

Moreover, the indications provided above regarding the FIGS. 1 and 3 also apply to the filter 70. A finger weighting can also be provided given a filter 70. Such finger weighting, as is known, results by providing the individual fingers 73 with differing depths in the substrate 10 and/or by resolving them into individual dots disposed in a row with a higher or lower linear density.

It has already been pointed out above that the spacings $a_i$ of the electrode fingers can also be non-equidistant. This, moreover, also applies to the weighted electrode fingers 23 and to the "split finger" arrangements 3'. For example, a non-equidistant spacing of a finger group 2, 61 . . . can be based on the fact that finger pairs have been omitted and thus the finger group has been thinned in terms of the finger electrodes. As has likewise been indicated above, the case of maximum electrode finger (reflector finger) density exists (apart from the case of a "split finger" arrangement) when the center spacings of adjacent fingers 3, 23, 3', 73 amount to $a_i = \lambda_o/2$, where $\lambda_o$ is the wavelength of the acoustic wave in the filter for the center frequency $f_o$ of the filter. Also, in the case of electrode fingers, adjacent electrode fingers are respectively connected to different bus bars 5 and 6 (and are a pair of fingers).

It is also of particular advantage to omit pairs of fingers 3, 23, 73 in the same sequence in each finger group 2, 61 . . . , i.e. to thin the finger groups. In particular, such a finger group then has equidistant spacings $a_1$ which are equal to a multiple, particularly an uneven multiple of $\lambda_o/2$. Even in such a thinned finger group, mutually adjacent fingers 3, 23 (when functioning as electrode fingers) are connected to respectively different bus bars 5 and 6, however with $a_1 = a_2 = a_3$. The overall length 1 of such a finger group amounts to a multiple of $n\lambda_o/2$. When, for example, one such pair of fingers (which consists of adjacent electrode fingers connected to different bus bars 5, 6 is omitted from an arrangement with maximum (i.e., $a_i = \lambda_o/2$) finger density, then the spacings $a_i$ of the remaining electrode fingers adjacent to one another (and respectively connected to different bus bars 5, 6) then amount to $a_i = 3\lambda_o/2$. $1 = 3 n\lambda_o/2$ then applies for the entire finger group 2. Dimensions for the width of the electrode or, respectively, reflector fingers which amount to approximately $\lambda_o/4$ are also preferred for such embodiments.

Although various minor modifications may be suggested by those versed in the art, it should be understood that we wish to embody within the scope of the patent warranted hereon, all such embodiments as reasonably and properly come within the scope of our contribution to the art.

We claim as our invention:

1. A pulse compression filter designed as a dispersive delay line which functions with acoustic waves and has a prescribed center frequency $f_o$ which produces a corresponding mean wavelength $\lambda_o$ in the filter, comprising: a substrate; at least one input and at least one output transducer with a plurality of electrode fingers situated at a surface of the substrate, a distribution of the electrode fingers corresponding to a prescribed transfer function which has a prescribed bandwidth B and whose Fourier transform has a prescribed time duration T; electrode fingers being divided into a plurality of N finger groups designed identical to one another with respect to the number of fingers n and corresponding finger spacings of corresponding fingers; each finger group having a length in a propagation direction of the acoustic wave in the filter which is at least equal to said mean wavelength $\lambda_o$; center spacings of adjacent finger groups from one another being non-equidistant in accordance with said prescribed transfer function; and the plurality N of the finger groups being greater than the time bandwidth product (T·B).

2. A pulse compressioon filter according to claim 1 wherein the finger spacings within the individual finger group are equidistant from one another.

3. A pulse compression filter according to claim 1 wherein the electrode fingers are designed as split finger arrangements comprising electrode strips.

4. A pulse compression filter according to claim 1 wherein the fingers are weighted in the individual finger groups.

5. A pulse compression filter according to claim 4 wherein the weighting of the fingers is uniform within the individual finger groups so that the individual finger groups are non-identical arrangements with respect to the finger weighting.

6. A pulse compression filter according to claim 1 wherein a length of an individual finger group is a multiple of $n \cdot \lambda_o/2$.

7. A pulse compression filter designed as a dispersive delay line which functions with acoustic waves and has a prescribed center frequency $f_o$ which produces a corresponding mean wavelength $\lambda_o$ in the filter, comprising: a substrate; at least one input and at least one output transducer; and a reflector arrangement with a plurality of reflector fingers situated at a surface of the substrate, a distribution of the reflector fingers corresponding to a prescried transfer function which has a prescribed bandwidth B and whose Fourier transform has a prescribed time duration T; the reflector fingers being divided into a plurality of N finger groups designed identical to one another with respect to the number of fingers n and corresponding finger spacings of corresponding fingers; each finger group having a length in a propagation direction of the acoustic wave in the filter which is at least equal to said mean wavelength $\lambda_o$; center spacings of adjacent finger groups from one another being non-equidistant in accordance with said prescribed transfer function; and the plurality N of the finger groups being greater than the time bandwidth duration product (T·B).

8. A pulse compression filter according to claim 7 wherein the finger spacings within the individual finger group are equidistant from one another.

9. A pulse compression filter according to claim 7 wherein the fingers are weighted in the individual finger groups.

10. A pulse compression filter according to claim 9 wherein the weighting of the fingers is uniform within the individual finger groups so that the individual finger groups are non-identical arrangements with respect to the finger weighting.

11. A pulse compression filter according to claim 7 wherein a length of an individual finger group is a multiple of $n \cdot \lambda_o/2$.

* * * * *